United States Patent
Bankman et al.

(10) Patent No.: US 7,760,013 B2
(45) Date of Patent: Jul. 20, 2010

(54) TRANSADMITTANCE AND FILTER HAVING A GAIN FUNCTION

(75) Inventors: Jesse R. Bankman, Gibsonville, NC (US); Kimo Y. F. Tam, Lincoln, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 12/192,505

(22) Filed: Aug. 15, 2008

(65) Prior Publication Data

US 2009/0195304 A1    Aug. 6, 2009

Related U.S. Application Data

(60) Provisional application No. 61/026,597, filed on Feb. 6, 2008, provisional application No. 61/026,571, filed on Feb. 6, 2008.

(51) Int. Cl.
*H03K 5/00* (2006.01)
(52) U.S. Cl. .................. 327/553; 327/552; 327/559
(58) Field of Classification Search ......... 327/551–559, 327/103
See application file for complete search history.

(56) References Cited

U.S. PATENT DOCUMENTS

| | | | |
|---|---|---|---|
| 2,096,027 A | 10/1937 | Bode | |
| 2,242,878 A | 9/1939 | Bode | |
| 3,689,752 A | 9/1972 | Gilbert | |
| 4,156,283 A | 5/1979 | Gilbert | |
| 4,586,155 A | 4/1986 | Gilbert | |
| 5,077,541 A | 12/1991 | Gilbert | |
| 5,684,431 A | 11/1997 | Gilbert et al. | |
| 5,734,294 A * | 3/1998 | Bezzam et al. | 327/552 |
| 6,757,327 B1 | 6/2004 | Fiedler | |
| 7,023,259 B1 * | 4/2006 | Daniell et al. | 327/536 |
| 7,109,795 B2 * | 9/2006 | van Zeijl | 330/254 |
| 7,439,792 B2 * | 10/2008 | Kwak et al. | 327/534 |

OTHER PUBLICATIONS

Baker, Alan J. "An Adaptive Cable Equalizer for Serial Digital Video Rates to 400MB/s", IEEE International Solid-State Circuits Conference, Digest of Technical Papers, pp. 174-175., Mar. 9, 1996.
Liu, J. and Lin, X., "Equalization in High-Speed Communication Systems," IEEE Circuit and Systems Magazine, Q2. 2004, p. 12.
Choi, J.S., et al., "Adaptive Cable Equalizer Using Enhanced Low-Frequency Gain Control Method," IEEE Journal of Solid-State Circuits, vol. 39, No. 3., Mar. 2004, pp. 419-425.
Shakiba, M., "A 2.5 Gb/s Adaptive Cable Equalizer," IEEE International Solid-State Circuits Conference Digest of Technical Papers, Feb. 17, 1999, pp. 396-397.

* cited by examiner

*Primary Examiner*—Dinh T. Le
(74) *Attorney, Agent, or Firm*—Kenyon & Kenyon LLP

(57) ABSTRACT

Disclosed are a circuit and a method for tuning a programmable filter including input terminals, output terminals, a filter network and a transadmittance stage. The input terminals can receive input signals, and the output terminals output a filtered signal. The transadmittance stage, coupled to the input terminals, generates a current at its output based on the input signals. The output of the transadmittance stage can be coupled to the output terminals. The filter network can be a resistive-capacitive network connected to the input terminals. The RC network can include a capacitance respectively coupling the input terminals to output terminals, and a voltage divider network coupling the input and output terminals together. The transadmittance stage output terminals can be connected to the voltage divider, and the output terminals of the programmable filter circuit are coupled to respective intermediate nodes of the voltage divider network to provide a filtered output signal.

20 Claims, 14 Drawing Sheets

TRANSADMITTANCE AND FILTER HAVING A GAIN FUNCTION

This application claims the benefit of priority from U.S. provisional applications having Ser. Nos. 61/026,597 and 61/026,571, filed Feb. 6, 2008, the disclosures of which are incorporated herein by reference in their entirety.

BACKGROUND

The present invention relates to equalizers having programmable frequency response. In particular, it relates to a programmable equalizer that avoids switched resistor/capacitor (RC) networks that previously were prevalent in the art by providing a transadmittance amplifier in lieu of the switched RC network.

Programmable filters are known that include a switched network of resistors (FIG. 1) and capacitors (FIG. 2) that are switched in and out of the filter circuit depending upon the frequency response desired from the filter, (FIG. 3 and FIG. 4, respectively). A RC network may include a voltage divider circuit that includes a number of resistors (e.g., 2 or more) with intermediate nodes provided between them that are coupled to output terminals via selection switches. Depending on the frequency response desired, a desired selection switch or switches are rendered conductive to couple the desired node to the output through a desired amount of conductance. Similarly, the RC network may include a large number of capacitors each coupled to the output node via respective selection switches. The capacitor selection switches may be rendered conductive selectively to tune the overall capacitance of the RC network to a desired level.

The various switches typically are provided by MOSFET transistors. The MOSFET transistors, however, each introduce some resistance and capacitance to the RC network because they are not perfect devices. Generally, the ON resistance of the MOSFET switch is lower for larger MOSFET transistors. However, as the MOSFET switch is made larger, its device capacitances also increase, (e.g., $C_{gd}$, $C_{gs}$, $C_{db}$, and $C_{sb}$). This leads to a dilemma because the higher OFF capacitance affects the high frequency gain of the filter. This can ultimately limit the performance of the filter. The parasitic capacitance of the MOSFET when switching resistors, and the parasitic resistance of the MOSFET when switching capacitors, adversely effects filter performance.

The following discussion will build on aspects of a high-pass filter, as shown in FIG. 5, since this form is most commonly used in equalizers designed to compensate the typically low-pass nature of a communication channel's physical media. It will be immediately apparent to one schooled in the art that the methods and embodiments described herein may be advantageously applied to low-pass, bandpass and other filter and circuit forms.

FIG. 5 shows the canonical implementation of a high-pass filter in single-ended form. FIG. 6 is a well known differential version of this high-pass filter. The solid curves in FIG. 4 and FIG. 3 (curves 330 and 430 respectively), depict the magnitude of the filter's transfer function H(s) as a function of radian frequency, ω. Throughout the specification, when possible standard engineering variables are used. For example, the complex variable "s" is the Laplace parameter and has both real and imaginary parts, i.e. $s=\sigma+j\omega$. The term H(s) denotes the Laplace transform of a circuit's impulse response and is also referred to as the transfer function. The plots of transfer function magnitude, |H(s)|, as a function of radian frequency, ω, shown in FIG. 4 and FIG. 3, are known as Bode plots and describe the input to output behavior of the high-pass circuit for all frequencies.) As a further example, in response to an input voltage, Vin, a circuit characterized by transfer function H(s), will produce a voltage at the output, Vout, equal to Vin*H(s).

As an introduction, the operation of a filter such as that shown in FIG. 6. may be understood as follows. The resistors R1 and the capacitors C conduct current in response to the input voltages and according to their natures, their relation to each other and to other elements of the circuit. These currents flow to the output nodes, sum, and flow in R2, giving rise to the output voltages. Similar to the prior art of FIG. 2, the capacitive portion of current flowing to output node may be increased or decreased by switching in or out more capacitors, respectively. This gives rise to the change in the transfer function, for example, as shown FIG. 4, curves 410 and 420. Similar to FIG. 1, the resistive portion of the current flowing to the output node may be increased or decreased by switching in or out more resistor segments. This causes the change in the filter transfer function show in FIG. 3, curves 310 and 320. This change of the transfer function's magnitude in response to a user supplied input is commonly referred to as tuning the circuit. Such a filter may also commonly be referred to as programmable and as having a programmable transfer function.

Accordingly, the inventors perceived a need in the art for a filter with programmable frequency response that avoids the need for elaborate switched RC networks. In particular, there is a need for a filter that omits transistors from the RC network altogether.

Furthermore, while differential forms are discussed herein the described methods and invention are not limited to differential circuit configurations. The more complex differential forms described in the exemplary embodiments are an extension of the methods and invention that are applicable to single-input or multiple input forms and are within the capability of one of ordinary skill in the art after understanding the following disclosure.

DETAILED DESCRIPTION

To overcome the problems associated with the parasitic resistance and capacitance, the MOSFET switches or any other types of switches and the switched resistor or capacitor elements can be replaced with a transadmittance stage that generates a current similar to the current that would be generated by the switched R or C element in response to an input voltage. An aspect of embodiments of the present invention is to reduce the parasitic resistance and parasitic capacitance by replacing the tuning function of the commonly-used switches and switched passive elements in a circuit.

Embodiments of the present invention relate to a programmable filter circuit. The programmable filter circuit includes an input terminal, an output terminal, a filter network and a transadmittance stage. The input terminal receives an input signal, and the output terminal outputs a filtered signal. The transadmittance stage, coupled to the input terminal, generates a current at its output based on the received input signal. The output of the transadmittance stage is coupled to the output terminal. The filter network is connected to the input terminal. In one embodiment of a high-pass filter, the filter network includes a capacitance respectively coupling the input terminals to output terminals, and a voltage divider network coupling the input terminals together. The transadmittance stage output terminal are connected to the voltage divider, and the output terminals of the programmable filter circuit are coupled to respective intermediate nodes of the voltage divider network.

Another embodiment of the present invention relates to a method of tuning the frequency response of a circuit. The method includes sampling differential input voltages. A transadmittance stage generates differential currents based on the difference between the differential input voltages and based on an input control signal. The differential input voltages are applied to an resistive-capacitive network thereby generating a current in the resistive-capacitive network. The differential currents generated by the transadmittance stage are injected into a node of the resistive-capacitive network to sum with the current generated by the network's elements in response to the differential input voltages. At a first resistance in the resistive-capacitive network, a first voltage is sampled, and, at a second resistance in the resistive-capacitive network, a second voltage is also sampled.

According to the exemplary embodiments, it is not necessary that the current delivered to the output nodes be developed by switched resistive or capacitive segments. The scheme shown in FIG. 7 may alternately be used to develop currents with similar or desired natures to either the capacitors or resistors, such as 715 and 725 and to deliver these generated currents to the outputs. Additional current shapes may be synthesized by the transadmittance stage Y(s) 710 to create other transfer functions.

Figure 2:
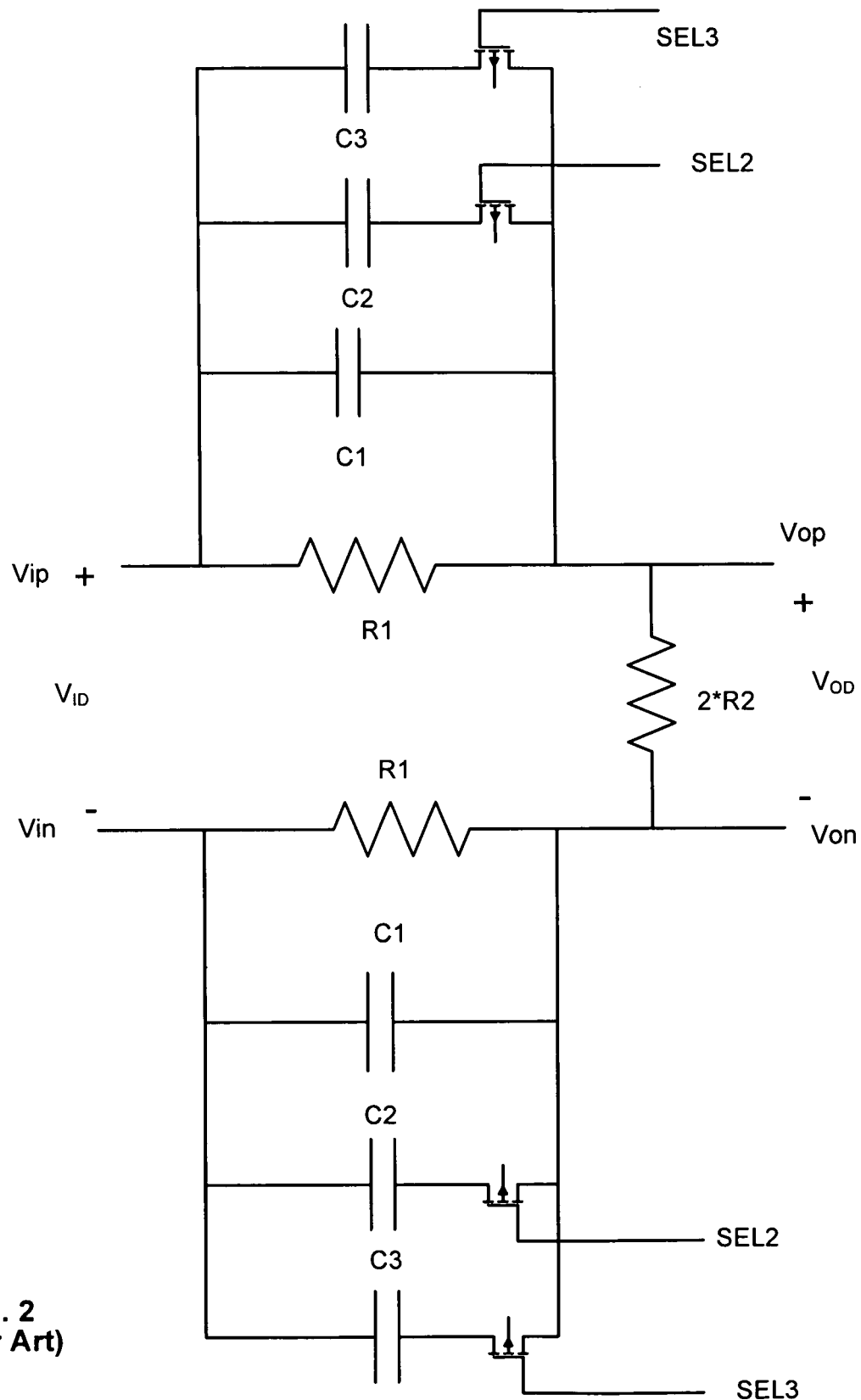
FIG. 2 illustrates a method of prior art using switched capacitor segments for varying the transfer function of the high-pass filter.
Figure 6:
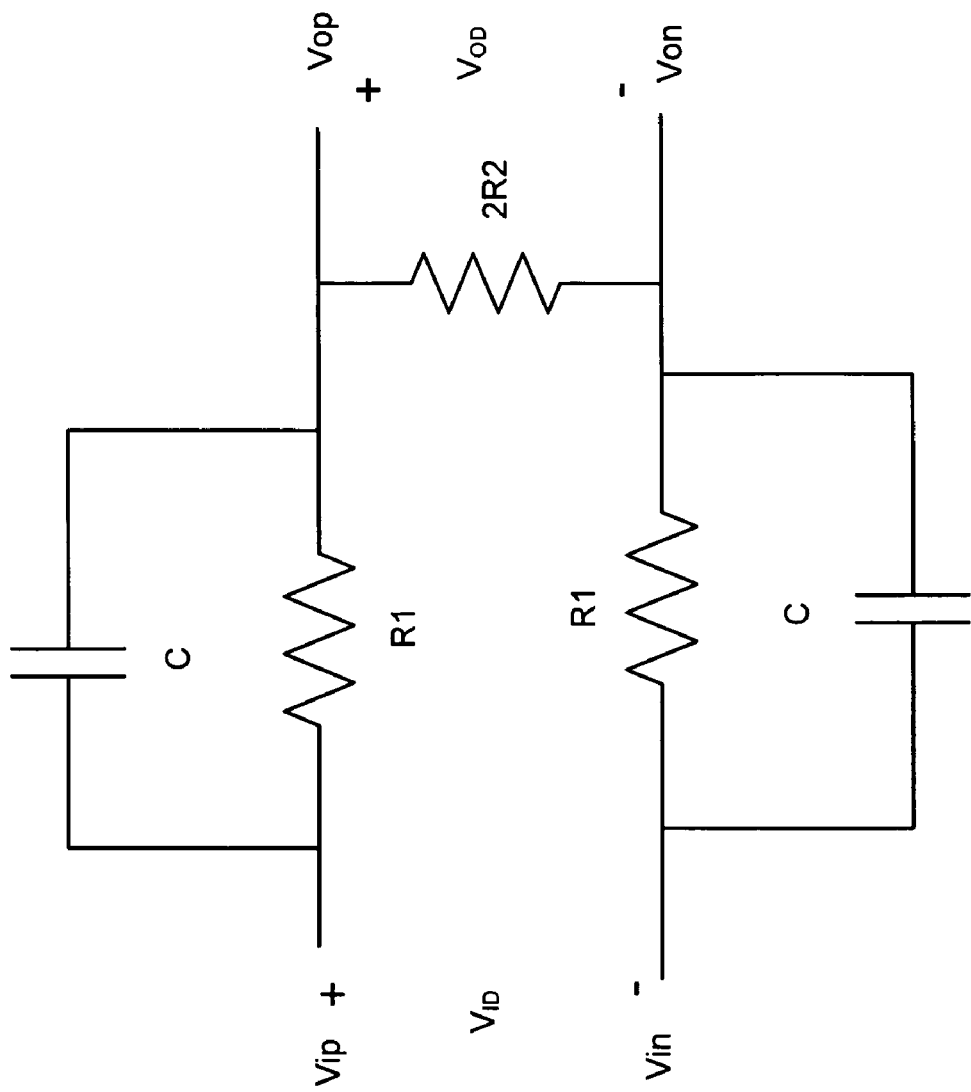
FIG. 6 illustrates a differential form of the high-pass filter as illustrated in FIGS. 1 and 2.
Figure 7:
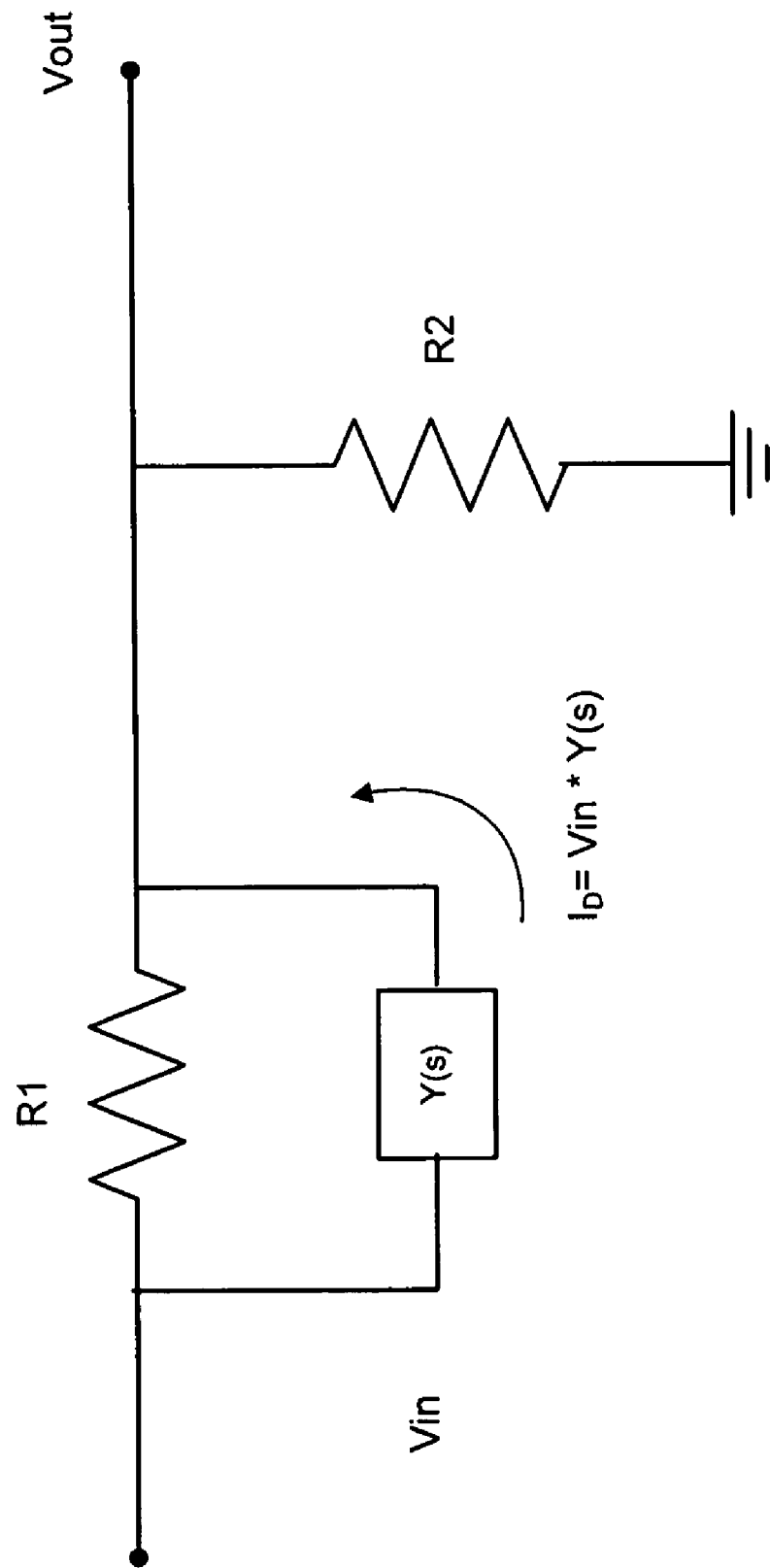
FIG. 7 illustrates the use of a transadmittance stage according to a single-ended embodiment of the present invention.
Figure 8:
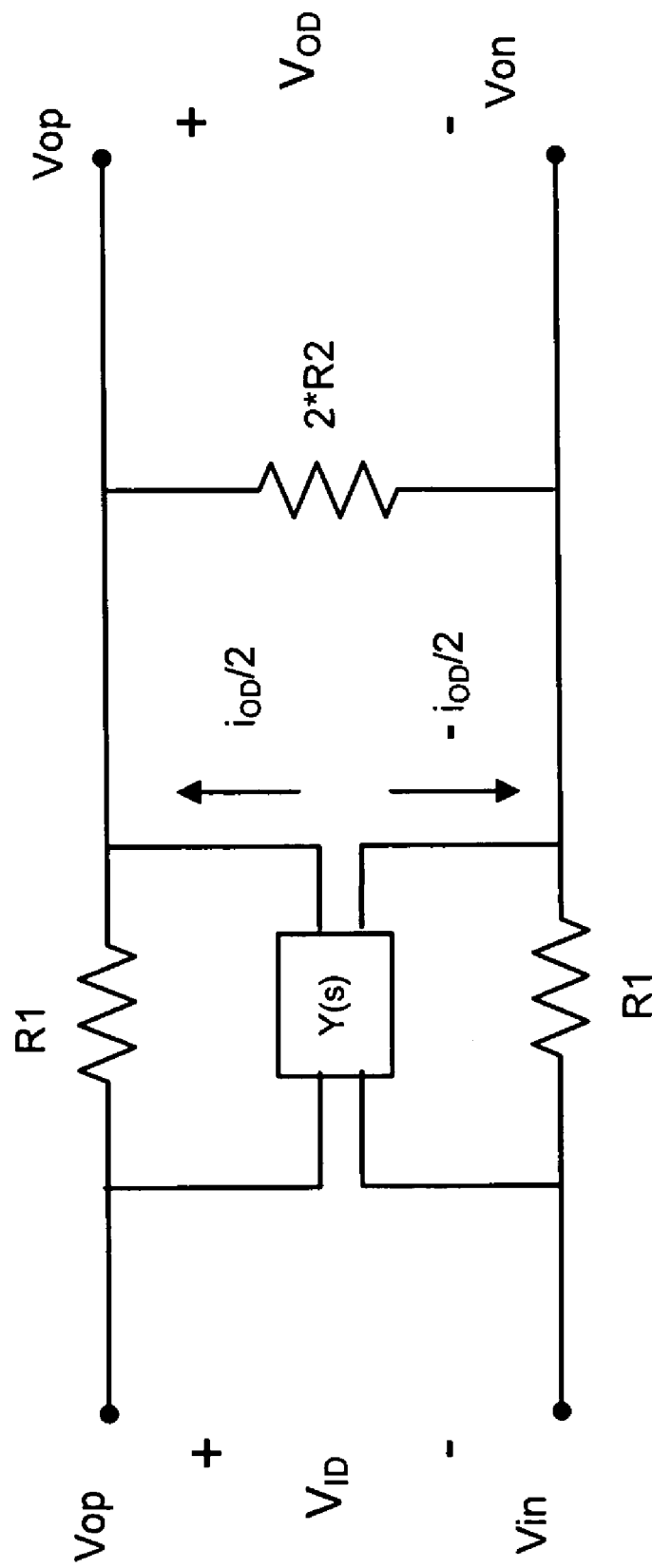
FIG. 8 illustrates the use of a transadmittance stage according to a differential embodiment of the present invention.

FIG. 7 shows a resistive network coupled between input and output. To create a high-pass transfer function, the Y(s) stage 710 creates a capadtive current (ID=Vin*Y(s)) in response to an input voltage Vin and directs this current to the-output nodes. Similarly, FIG. 8 shows a differential form of the circuit shown in FIG. 7. The resistive components, 801 and 802, correspond to the resistors shown in FIG. 6, and 803 can correspond to 2*R2. The transadmittance element, Y(s), creates a differential current in response to the differential input voltage, VID, and delivers this current to the output nodes, Vop and Von. According to an exemplary embodiment of the invention, for a range of input voltages, the transadmittance current can be made substantially equal to the capacitive current generated by the elements C of FIG. 6, such that some fraction of or all of the elements C may be replaced by Y(s) (805) and the transfer function of FIG. 4 can be realized. In as much as switched capacitor segments C2 and C3 of FIG. 2 serve to change the amount of capacitance that appears between input and output nodes, these elements and their associated switches may be replaced by the programmable Y(s) generating a substantially capacitive current while still realizing the transfer function responses shown in FIG. 4. Furthermore, the magnitude of current produced by Y(s) may be modulated by a control signal Ko (804) in order to change the amount of capacitance synthesized by Y(s).

Figure 1:
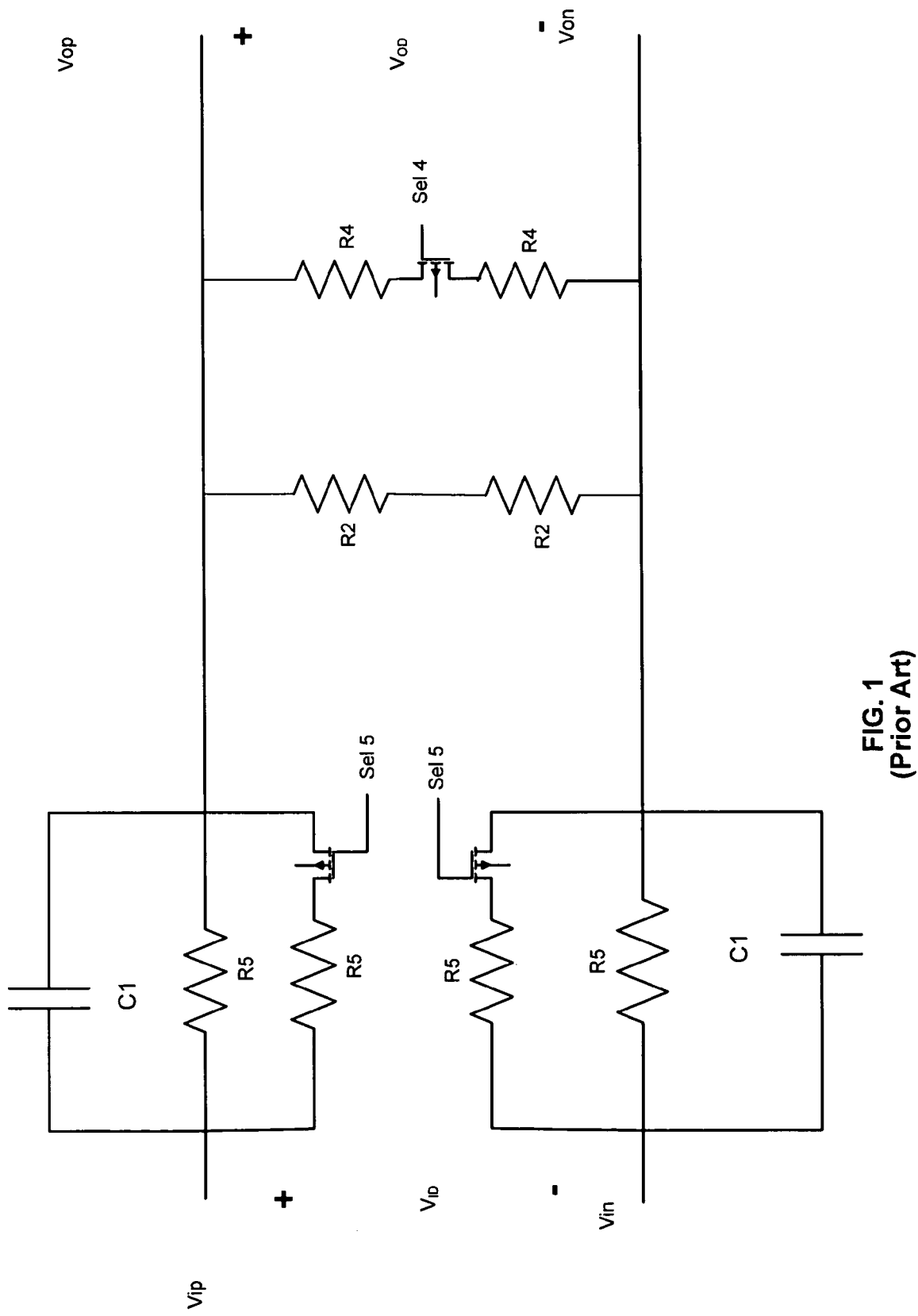
FIG. 1 illustrates a method of prior art using switched resistor segments for varying the transfer function of a high-pass filter.

It is, of course, possible to make the Y(s) current substantially equal to the current produced by a fraction or all of the resistors in FIG. 6, and accordingly replace some fraction of or all of the resistive elements with the transadmittance Y(s) and the transfer function of FIG. 1 can be realized. In as much as switched resistor segments R4 and R5 in FIG. 1 serve to change the amount of resistive current that flows between the input and output nodes, these elements and their associated switches may be replaced by a programmable Y(s) generating a substantially resistive current while still realizing the transfer function responses shown in FIG. 3.

Figure 9:
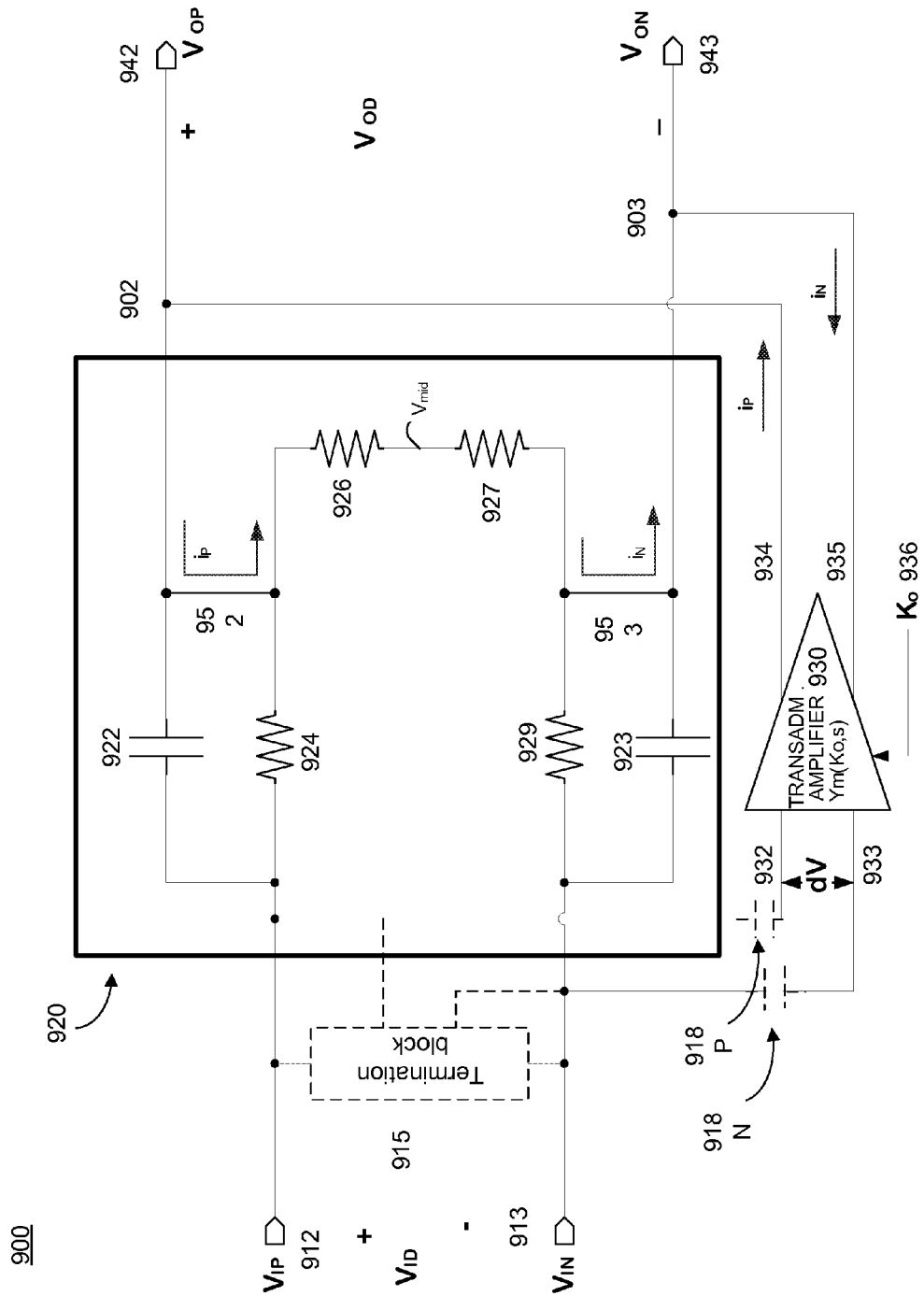
FIG. 9 illustrates a circuit according to an embodiment of the present invention.

FIG. 9 illustrates a filter circuit 900 according to an embodiment of the present invention. The circuit 900 may include inputs 912, 913, a resistive-capacitive (RC) network 920, a transadmittance stage 930, and filter outputs 942, 943. The RC network 920 and transadmittance stage 930 are connected to the inputs 912, 913. The outputs of the RC network and the outputs 934, 935 of the transadmittance stage 930 are connected to the filter outputs 942, 943 at nodes 902, 903.

The RC network 920 can comprise capacitive devices 922 and 923, such as capacitors, transistors or other devices that have capacitance, and resistive devices, 924, 926, 927, and 929, such as resistors, transistors, or other devices that provide a resistance. The resistive devices 924, 926, 927 and 929 form a voltage divider. The voltage divider is connected across the inputs 912 and 913, and has connections to the outputs 942 and 943, respectively. The connections of the voltage divider to outputs 942 and 943 are positioned at a point in the voltage divider to attenuate low-frequency input signals by a predetermined value. Capacitor 922 provides a bridge between input terminal 912 and filter output 942, and capacitor 923 provides a bridge between input terminal 913 and filter output 943.

Transadmittance stage 930 can comprise inputs 932 and 933, an amplifier and outputs 934 and 935. The transadmittance stage generates a differential current in response to the differential voltage applied at the inputs 932 and 933. The inputs 932 and 933 to the transadmittance stage 930 can be directly connected to input terminals 912 and 913, respectively. Transadmittance stage 930 can have an input for a control signal Ko 936 that allows the gain Ym(Ko,s) of the transadmittance amplifier to be programmable. The control signal Ko can be either an analog or digital control signal. The gain Ym(Ko,s) can be a function of Ko. The outputs 934 and 935 of the transadmittance stage are connected to nodes 902, 903.

Alternatively, the transadmittance stage 930 inputs 932 and 933 can be connected at intermediate points within an optional termination block 915. Optional termination block 915 can provide impedance matching for the differential input voltage on input terminals 912 and 913. In addition, optional capacitors 918P, 918N can provide AC-coupling for the transadmittance stage 930, thereby allowing only high frequency signals to be applied to the transadmittance stage 930. Furthermore, these capacitors may be connected to intermediate nodes in the termination block 915 to deliver a scaled version of the input signal to the transadmittance amplifier 930. Reducing the input dynamic range the transadmittance stage supports can simplify the design. An input signal is input across inputs 912, 913. For differential circuit forms in general and for the circuit shown in FIG. 9, the voltage difference between the input voltages is commonly referred to as the differential input voltage, Vid. That is, Vid=Vp−Vn. The average of the two single-ended input voltages, Vip and Vin, is referred to as the common-mode input voltage, Vicm. That is, Vicm=(Vip+Vin)/2. Similarly at the output, the differential output voltage, Vod, is equal to the difference of the voltage at Vop 942 and the voltage at Von 943. That is, Vod=Vop−Von. While a circuit's operation can always be analyzed in terms of single-ended voltages and currents, for differential circuits it is often clearer to describe circuit operation in terms of differential and common-mode behavior. Furthermore, in differential signal chains which may consist of a cascade of differential circuits, it is often the case that the signals of interest are driven and received differentially and that any common-mode characteristics of the signals are ignored or purposefully attenuated. The input signals across inputs 912 and 913 can be an analog voltage of varying amplitude, frequency and phase. The differential input signal causes a corresponding differential output signal to be generated at the output terminals 934, 935. The output signal is determined not only by the input signal but also by the frequency response of the RC network 920 and the transadmittance amplifier 930.

The RC network 920 generates a frequency response based on the capacitors and resistors contained therein. High frequency components of the differential input signal can propagate from input terminals 912, 913 to output terminals 942, 943 via capacitors 922, 923 with minimal attenuation. The voltage divider network (resistors 924, 926, 927 and 929) provides attenuation of low frequency signals. For low frequency signals the differential output voltage observed between terminals Vop 942 and Von 943 is equal to the ratio of the sum of resistors 926+927 to the sum of resistors 924+926+927+929. The precise nature of the frequency response is determined by the magnitude of the capacitors and resistors in the RC network.

The input signal at inputs 932 and 933 of the transconductance stage 930 is proportional to Vip−Vin (shown as dV). The transadmittance stage 930 may generate a differential output current id, equal to the difference of currents ip and in, in response to differential input. The differential current id can equal Ym(Ko,s)*dV. The differential current generated by the transadmittance stage 930 propagates to nodes 902, 903 and, via connections 952, 953, through the voltage divider formed by resistors 926 and 927. The transadmittance stage 930 has a transfer function Ym(Ko, s) that can have an output that can be designed to have variable gain and phase over frequency. Thus, the current injected through resistors 926, 927 contribute to the output voltage at terminals 934, 935.

Figure 10:
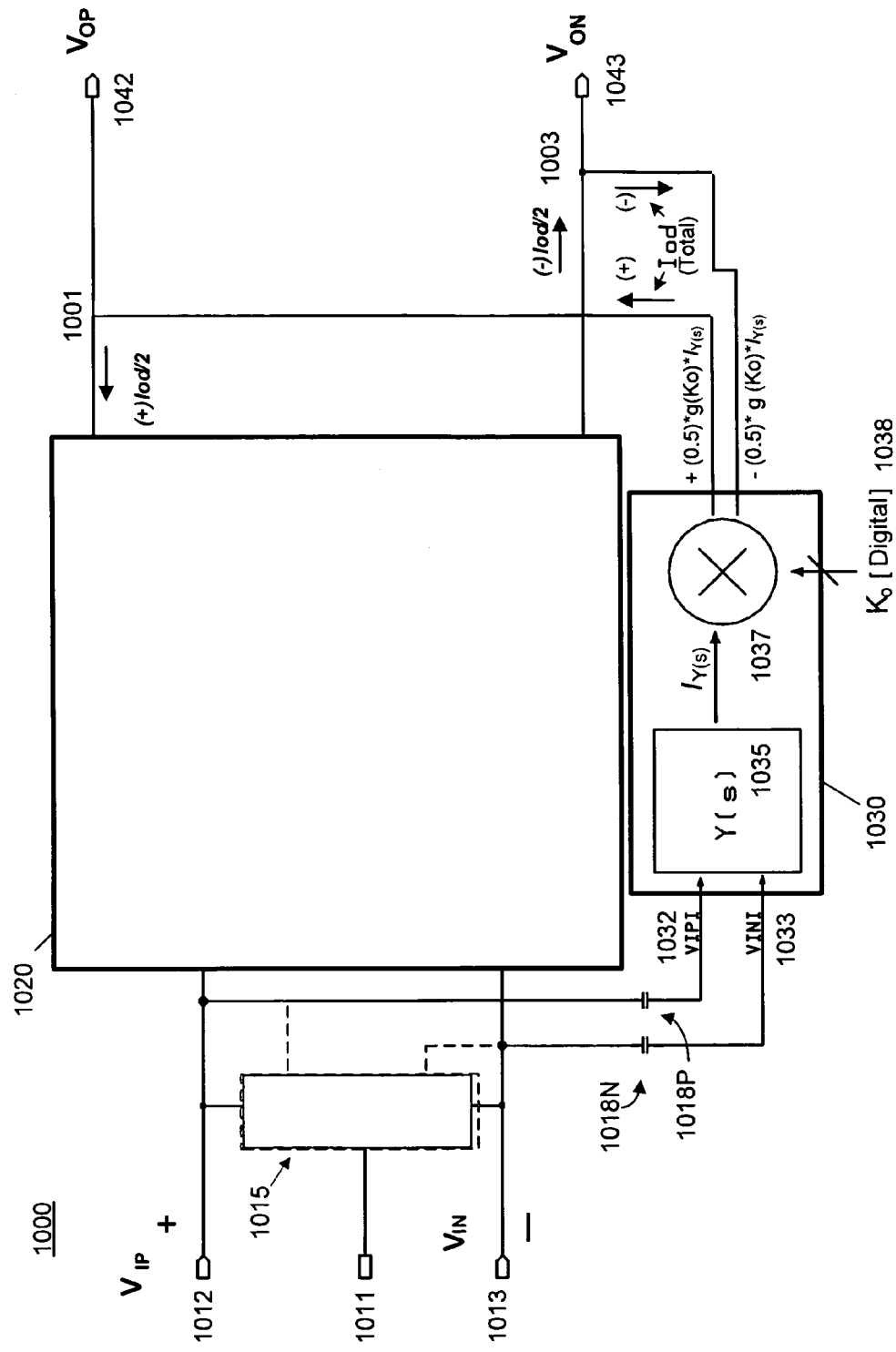
FIG. 10 illustrates a block diagram according to another exemplary embodiment of the present invention.

FIG. 10 illustrates a filter 1000 according to another embodiment of the invention. The circuit in FIG. 10 is arranged substantially in the same manner as the circuit of FIG. 9, so the arrangement of familiar components will not be further described. Also shown are optional ac-coupling capacitors 1018N and 1018P connecting the transadmittance stage 1030 to the outputs from termination block 1015. Optional termination block 1015 performs the same function as termination block 915 in FIG. 9.

The RC network 1020 can be substantially the same as illustrated in FIG. 9. The transadmittance stage 1030 includes transadmittance amplifier 1035 and multiplier 1037. The currents generated by the transadmittance stage 1030 propagate to output nodes 1042 and 1043, and, via connections 1002, 1003, to RC network 1020.

Transadmittance stage 1030 synthesizes transadmittance conversion of the input voltage VIPI and VINI applied at inputs 1032 and 1033, respectively, to a current IY(s). The current IY(s) is proportional to the difference between the input voltages VIPI and VINI. Control signal Ko 1038 can be a digital signal or analog signal that dictates the current multiplication factor, g. The differential currents generated by the transadmittance stage 1030 can be designed, using an appropriate transfer function, to have any frequency shape based on the impedance network Z of transadmittance amplifier 1035. The transadmittance stage 1030 alters the transfer function between the differential input of 1012 and 1013 and the differential output of 1042 and 1043 by increasing current through RC network 1020. The differential currents generated by the transadmittance stage 1030 may be complex currents having real and imaginary parts, and which may appear substantially conductive, reactive, or a combination of both.

The transfer function of the transadmittance stage 1030, including transadmittance amplifier 1035 and multiplier 1037, can be represented by Ym(Ko, s) and will output a current equal to g(Ko, s)*IY(s) in response to an input voltage. The transadmittance amplifier's 1035 transfer function Y(s) can have an output current IY(s), which is equal to dV*Y(s), where dV=(VIPI−VINI). Through the action of the termination block 1012 and selection of intermediate connection points for transadmittance stage inputs 1032 and 1033, (which optionally may be ac-coupled to the termination block through capacitors 1018N and 1018P), dV can be made proportional to the differential input voltage, Vid=Vip−Vin. The choice of coupling elements 1018N and 1018P realizes this proportionality over a range of frequencies. The transconductance stage's differential input voltage dV can be related back to the circuit's differential input voltage by, dV=Vid*α(s), where α(s) represents the frequency variable proportionality contributed by the termination block 1012 and the coupling elements 1018N and 1018P. The transadmittance stage 1030 differential output current relative to the circuit's 1000 differential input voltage is Iod=Vid*α(s)*Y(s)*g(Ko, s).

At high frequency, the capacitor 1022 connected to input 1012 (VIP) is a short circuit between output 1042 (Vop) and input 1012 (VIP). Similarly at high frequency, capacitor 1023 connected to input 1013 (VIN) is a short circuit between output 1043 (Von) and input 1013 (VIN). A current I222 through capacitor 1022 is dependent on the rate of change of voltage between output 1042 (Vop) and input 1012 (VIP), i.e., I222=C222*dv/dt. Similarly, the current I223 through capacitor 1023 is also dependent on the rate of change of voltage between output 1043 (Von) and input 1013 (VIN) but for a differential input signal is opposite in polarity, i.e., (−)I223=C223*dv/dt.

The differential current Iod output from the transadmittance stage 1030 can be equal to ±g(Ko)*IY(s). The differential current is applied to the RC network circuit at nodes 1002A and 1003A. Node 1002A connects to RC network 1020 and filter circuit output 1042 at node 1002. Node 1003A connects to RC network 1020 and output 1043 at node 1003. When a differential circuit is analyzed in terms of the single-ended currents that flow into or out of a single node, the single ended currents may be expressed as a sum of the circuit's differential and common-mode currents. For example, in FIG. 10 the transconductance stage's differential output current Iod is equal to the difference of the single-ended current flowing out of node 1002A and the single-ended current flowing into node 1003A. The single-ended currents can be written in terms of the differential and common-mode currents, so I202A=+Iod/2+Icommon-mode and I203A=−Iod/2+Icommon-mode, and it is well understood that these equations derive directly from the definitions of differential-mode and common-mode. For differential circuits, the differential mode operation may be of primary interest for signal transfer and the common-mode voltages or currents incidental quantities that are engineered to provide a stable bias point for circuit operation. Therefore, for the purpose of analyzing the signal transfer of a differential circuit as in FIG. 10, the common-mode voltages or currents are assumed equal to zero and the single-ended currents (those flowing out of node 1002A and into node 1003A, for example), are considered solely as comprised of a differential component, e.g. +Iod/2 and −Iod/2. The differential output current Iod of transadmittance stage 1030 is equal to g(Ko)*IY(s) as previously described and the single-ended output currents of 1030 can be equal to +0.5*g(Ko)*IY(s) and −0.5*g(Ko)*IY(s), though in many practical implementations these currents will have common-mode components required for setting a dc-bias point.

The differential output current through one half of the voltage divider network 1020 circuit is Iod/2, which is equal to [Vd(s)×Ym(Ko, s)*0.5], where Vd(s) is the differential voltage between the inputs 1032 (VIPI) and 1033 (VINI) into transadmittance stage 1030 and Ym(Ko, s) is the transfer function of the transadmittance stage 1030. Although multiplier 1037 is shown multiplying current, it could also multiply voltage, and gain g(Ko) of the transfer function Ym(Ko, s) can be a scalar between −1 and +1 and a function of the control input Ko.

The voltages VAP and VAN are sampled at the outputs 1042 and 1043, respectively. The differential output voltage, Vod=($V_{VOP}$−$V_{VON}$), is approximately equal to Vod=(I222−I223+Iod)*2R), where 2R is the resistor values in RC network 1020.

Figure 11:
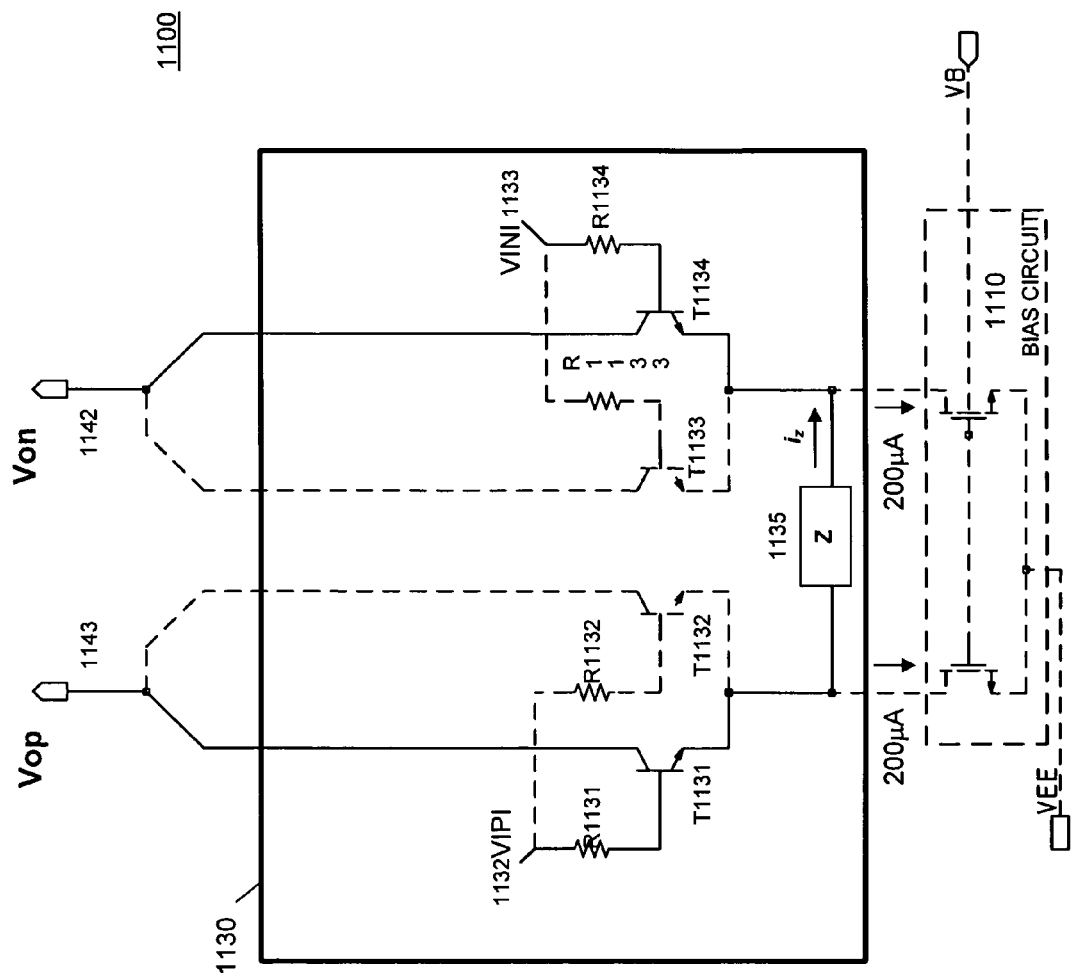
FIG. 11 illustrates a transadmittance stage of the circuits of FIGS. 1 and 2 according to exemplary embodiment of the present invention.

FIG. 11 illustrates a transadmittance stage 1100 according to an embodiment of the present invention. Transadmittance stage 1100 may include inputs 1112 and 1113, transistors T1131 and T1134, resistors R1131 and R1134, impedance element Z 1135, a bias circuit 1110, and outputs 1142 and 1143. Optionally, the transadmittance stage 1100 can include additional resistors R1132 and R1133 and transistors T1132 and T1133. Including the optional transistors, the transistors T1131, T1132, T1133 and T1134 can be arranged in pairs T1131-to-T1132 and T1133-to-T1134, the pairs T1131-to-T1132 and T1133-to-T1134 can be connected at the emitter through impedance Z 1135. Additional resistors and transistors can be connected to each of the pairs of transistors if desired.

The output 1142 is connected to the collector of transistor T1131 (and optional transistor T32), and output 1143 is connected to the collector of transistor T1133 (and optional transistor T34). Resistor R1131 is connected to the input 1132 and the base of transistor T1131 (and optional resistor R1132 is also connected to the input 1132 and the base of transistor T1132). Similarly, resistor R1134 is connected to the input 1133 and the base of transistor T1134 (and optional resistor R1133 is connected to the input 1133 and the base of transistor T1133). The voltages VIPI and VINI are applied to the inputs 1132 and 1133, respectively.

As described above, the transadmittance stage 1100 can be implemented with a single pair of transistors, e.g., T1131 and T1134, to each node OP and ON, or can be implemented with a number of additional transistors, such as T1132 and T1133 to pair with transistors T1131 and T1134. The additional transistors merely serve to split the current in each path to outputs OP and ON.

Impedance element Z 1135 may be a resistor, capacitor, inductor or combination of these elements. The voltage difference between VIPI and VINI is applied across the impedance element Z 1135. As voltages VIPI and VINI fluctuate, a differential current is generated and is output toward outputs ON and OP.

The following is an example combining the transadmittance stage of FIG. 11 with the RC network of FIG. 9. In the example, voltages VIPI and VINI are applied at the inputs 1132 and 1133 of transadmittance stage 1130 that results a differential voltage dV (VIPI−VINI) across transistor pairs T31 and T34. The differential voltage dV generates a current Iz through impedance element Z 1135 that is equal to dV*1/Z. Alternately, one can describe element Z's 1135 nature in terms of its admittance (commonly denoted by the variable Y) rather than its impedance Z. Since admittance is the inverse of impedance, (that is Y=1/Z), the current Iz is equal to dV*Y. Ignoring dc-current that set the circuit's bias point, the current ip output to node 1102 is substantially equal to ip=(dV)*(Ym(Ko,s)), where Ym(Ko,s) is the transfer function of the transadmittance stage 1130, and current in is equal to ip but in opposite direction.

Figure 3:
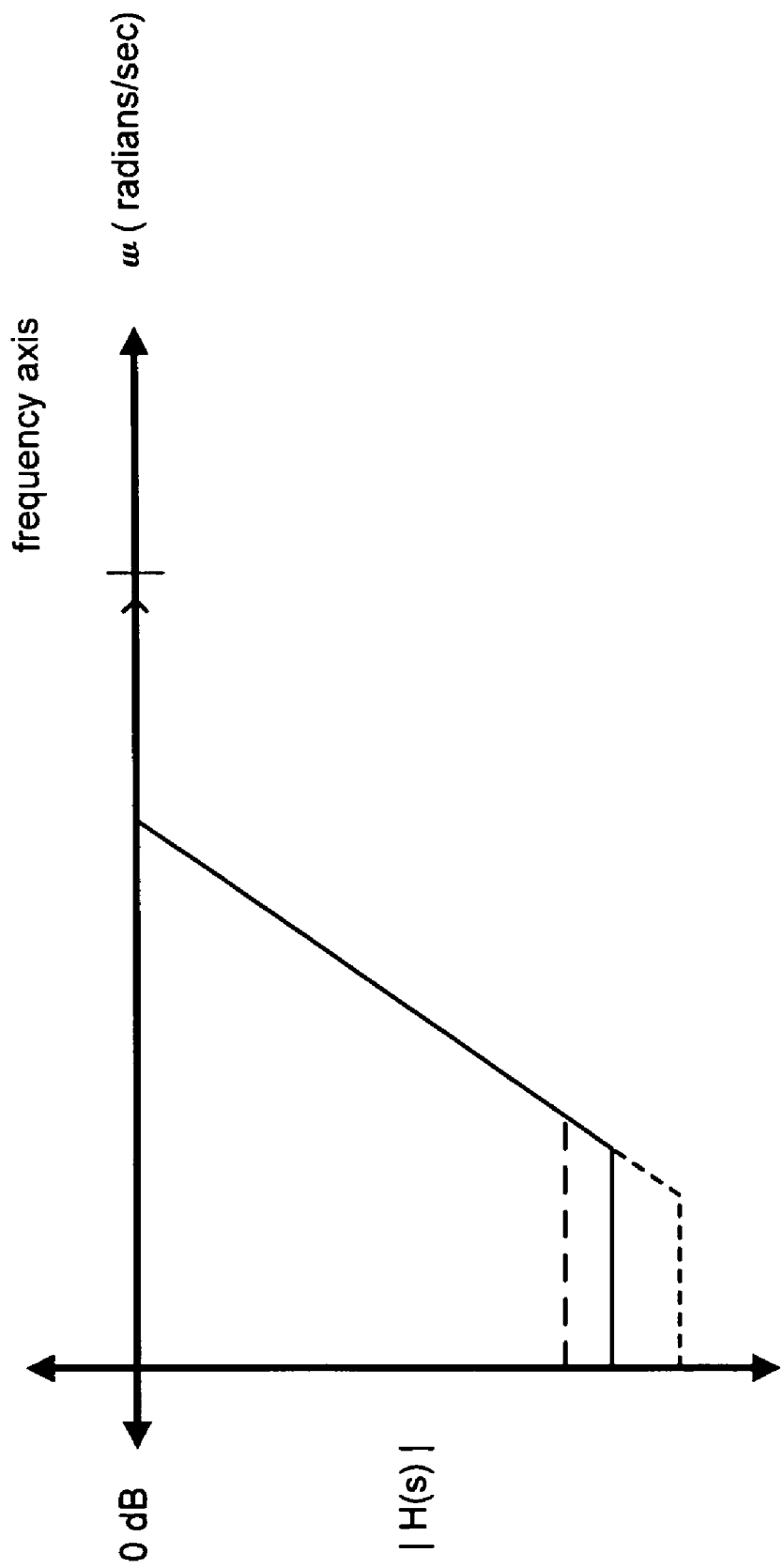
FIG. 3 illustrates a response of a transfer function of a high pass filter that varies according to the circuit depicted in FIG. 1.
Figure 4:
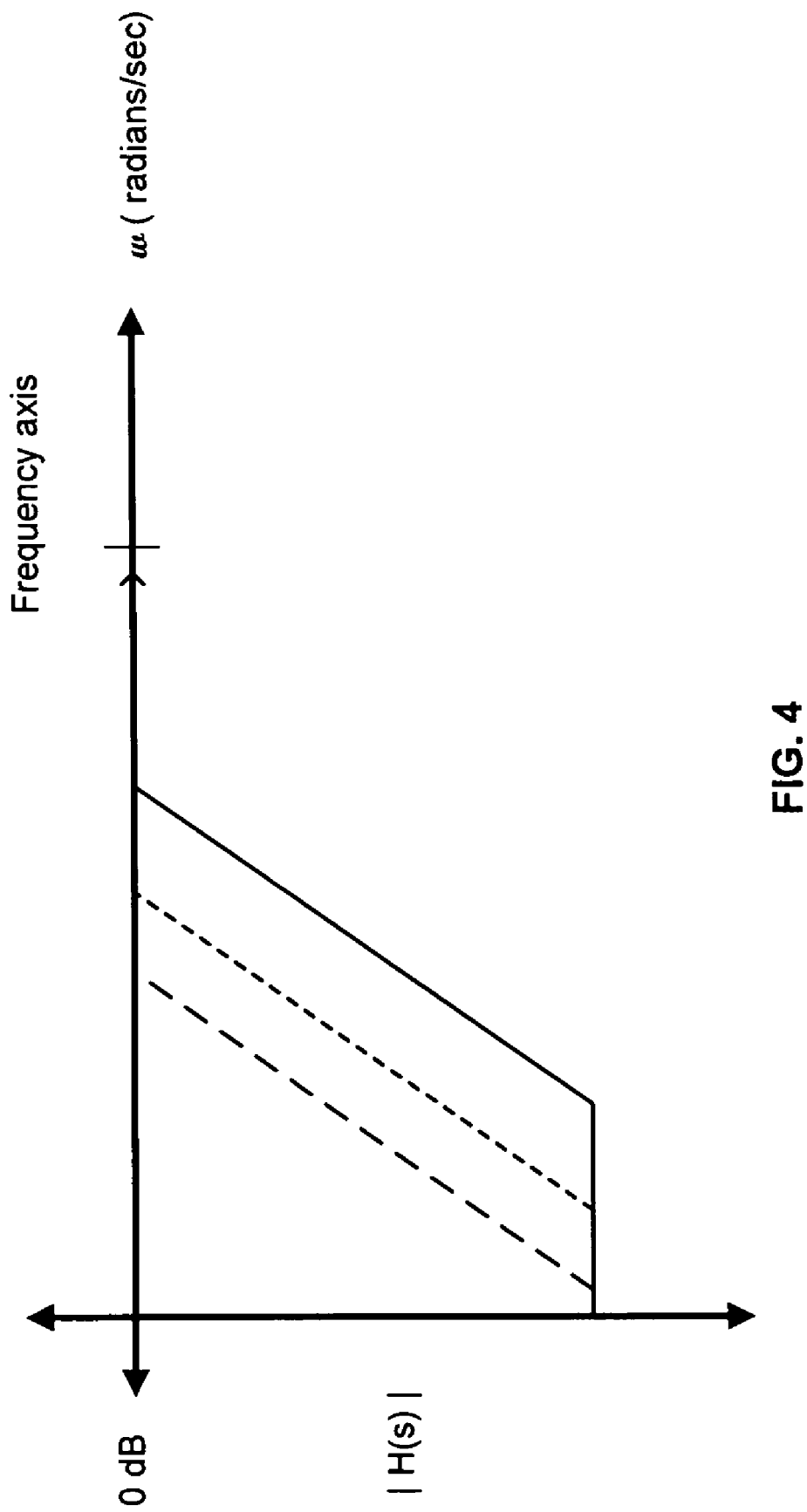
FIG. 4 illustrates a response of a transfer function of a high pass filter that varies according to the circuit depicted in FIG. 2.
Figure 5:
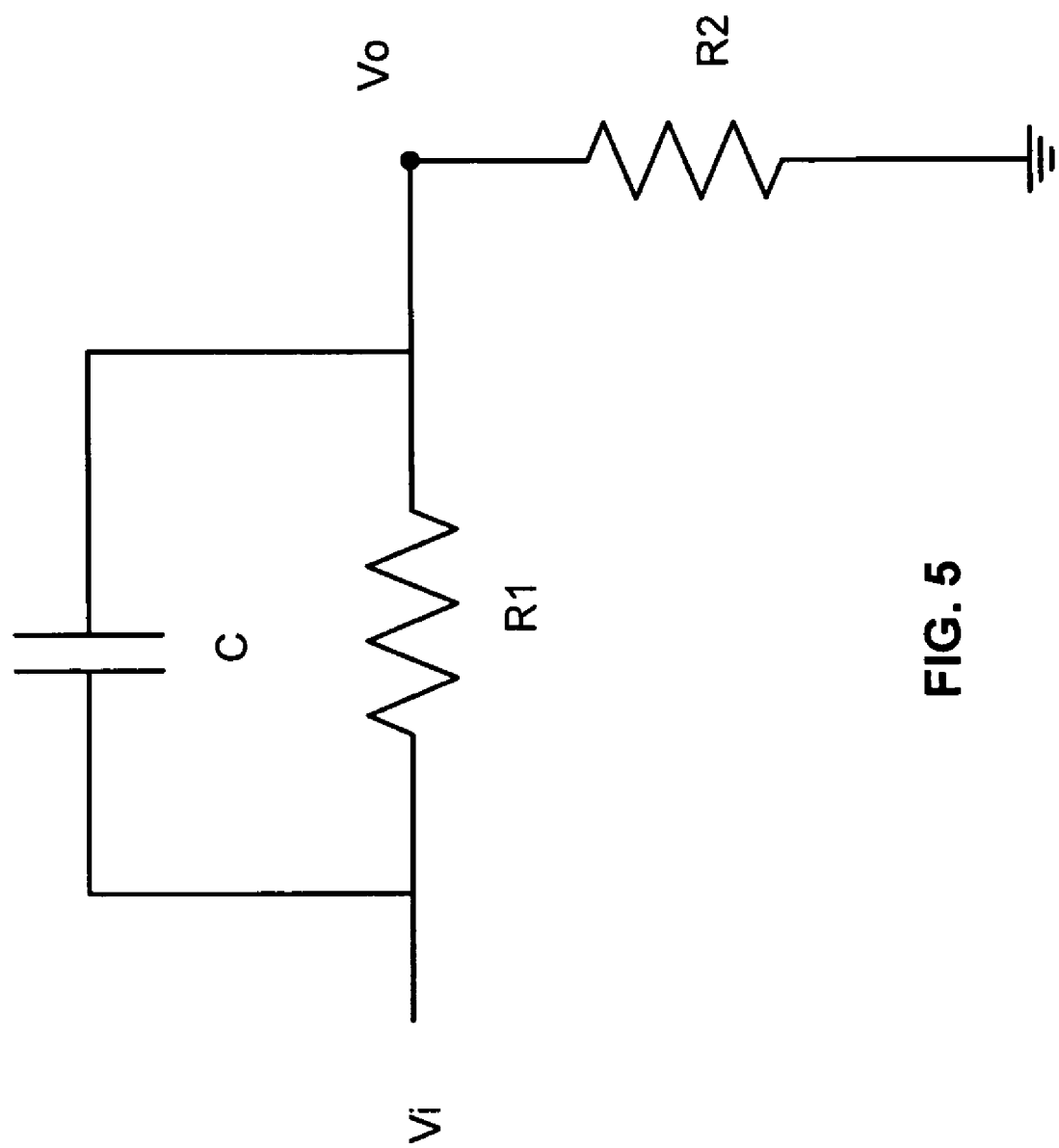
FIG. 5 illustrates a canonical single-ended form of high-pass filter.

Varying a filter's frequency response to account for variation in component values is referred to as tuning the filter and is typically done to provide a reproducible transfer function or range of transfer functions despite variation in component values due to manufacturing and environmental sources. Tuning a filter may also comprise altering the circuit's transfer function in response to a control input. The dotted-line curves in FIG. 4 and FIG. 3 provide examples of the transfer functions of tuned filters. The shape of the transfer function in each case is the same, (essentially high-pass), but the frequency location of the circuit's poles and zeros, (which dictate the breakpoints of the curves), vary in response to a control input.

The tuning of the filter occurs when the differential current id=ip−in generated by the transadmittance stage 1130 is output to the RC network 920 to combine with the differential current produced at the input of the RC network 920. The combination of currents and the impedances of the RC network generate the tuned output voltage that is sensed at outputs VON and VOP. In more detail with reference to FIG. 9, when a high frequency analog voltage Vid is applied to the inputs 912, and 913, respectively, a current passes through the capacitors 922, 923 in the filter. The current (ic122) through capacitor 922 is equal to (Vip−Vop)*s*C122. The current (iR124) through resistor 924 is equal to (Vip−Vop)*1/R124. The current ip added from the transadmittance stage 930 (1130) at node 902, as described above, combines with the currents ic122 and ir124 to produce a current ic122+ir124+ip. This current passes through resistors 926 and 927 to produce a voltage [(ic122+ir124+ip)*(R126+R127)] sensed from output 942 Vop to output 943 Von. Similarly, the return current in returning to the transadmittance stage 930 (1130) at node 903, as described above, combines with the current ic123 and current ir129 to produce a current ic123+ir129+in. For differential mode operation, these sums of currents are of equal magnitude but opposite in direction. That is, (ic122+ir124+ip)=−(ic123+ir129+in). An optional bias current from bias circuit 1110, shown in FIG. 11, can keep the transistors T1131 to T1134 on in the absence of current from impedance element Z 1135, or at low frequency.

The exemplary embodiment of the transadmittance stage 1130 shown in FIG. 11 is dependent on the value of Z, which can be a capacitor, resistor, inductor or combination thereof. It does not include the effects of control signal Ko. To add programmability, a mixer, (also known as a multiplier), can be added directly to the outputs OP, ON. However, a higher circuit supply voltage would be required, therefore another embodiment is preferable because a lower voltage can be used.

Figure 12:
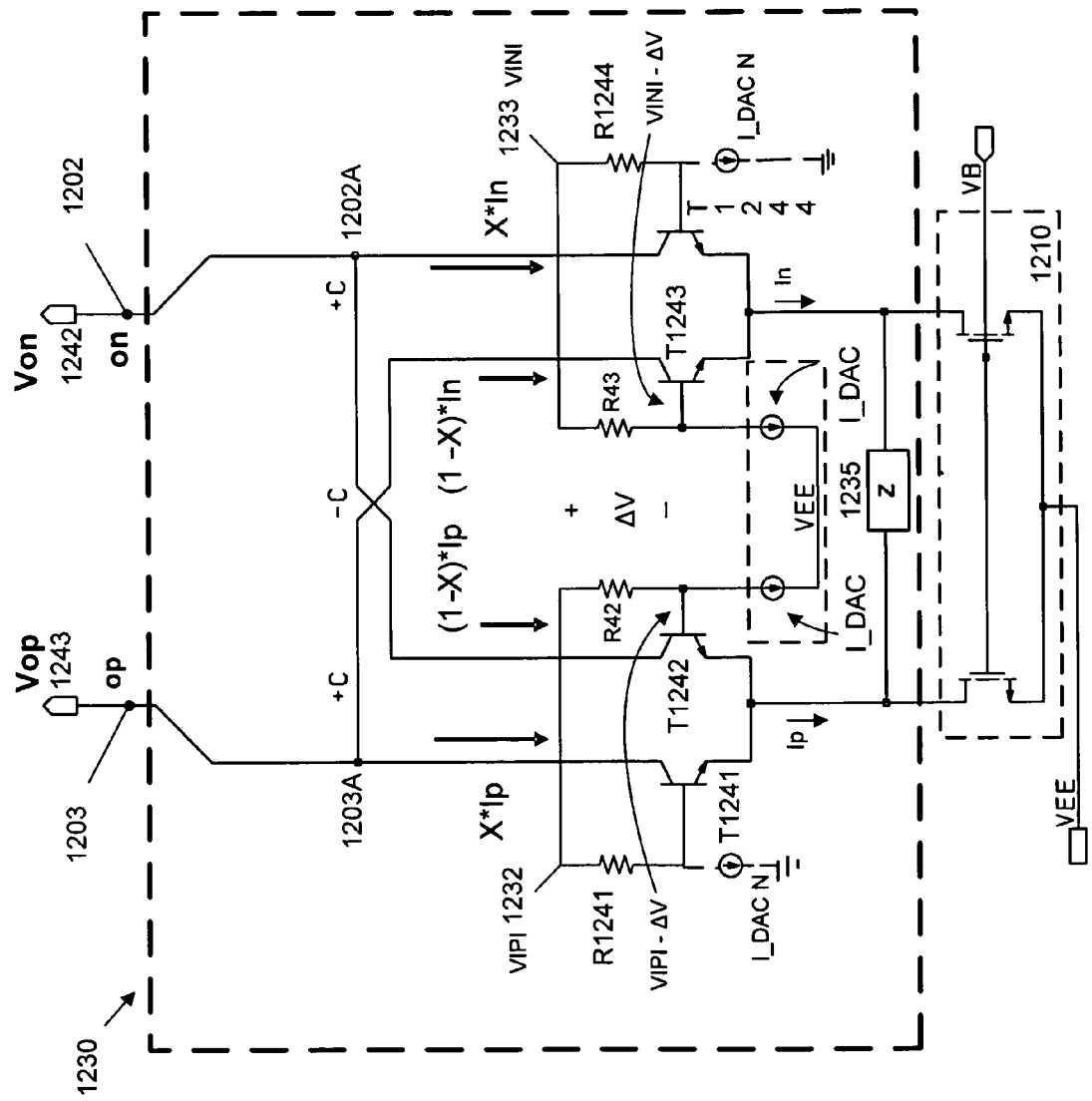
FIG. 12 illustrates another transadmittance stage in more detail according to exemplary embodiment of the present invention.

A folded mixer core, such as that shown in FIG. 12 including a transadmittance stage can be used to provide a lower voltage implementation. This circuit is a folded mixer including the transadmittance stage transfer function Y(s) implementation of FIG. 10.

The differential output of the transadmittance stage 1200 is still Iod as shown in FIGS. 9-11. Recall current Iod is the differential current generated by the transadmittance stage based on the input signals and the transfer function Ym(Ko, s) as shown in FIG. 9. The differential current Iod is set by the difference between VIPI and VINI, the control signal Ko, and the transadmittance Ym(Ko,s) of the transadmittance stage.

In the embodiment illustrated in FIG. 12, the collectors of transistors T1242 and T1243 are connected to the outputs 1242 and 1243, respectively. This configuration is different from that shown in FIG. 11. This configuration allows for the generation of positive and negative capacitance in the RC network connected to the nodes 1202 and 1203. This is accomplished by steering controlled fractions of the signal current created by the impedance element Z 1235 though inverting (T1242, T43) and non-inverting (T1241, T1244) paths to the common outputs 1242 and 1243. If all the signal current is steered through the non-inverting path, the transadmittance stage 1230 appears to synthesize a transadmittance, Y(s), equal to 1/Z. If all the signal current is steered though the inverting path, the transadmittance stage 1230 appears to synthesize a transadmittance, Y(s), equal to −1/Z. For fractions of signal current split between the inverting and non-inverting paths, an intermediate value of transadmittance can be synthesized. It is possible to achieve Y(s) in the range, $-1/Z \leq Y(s) \leq 1/Z$. Furthermore, this circuit behavior can be modeled as a transadmittance, Y(s)=1/Z, multiplied by a variable k, where k assumes a value between −1 and 1, according to how the currents split between inverting and non-inverting paths. (The variable k will be referred to henceforth as the "multiplication constant" while the fractional split of signal current between inverting and non-inverting transistor pairs will be described by a modulation factor, X.)

For the circuit of FIG. 12, the non-inverting path currents are shown as X*Ip and X*In, while the non-inverting path currents are shown as (1−X)*Ip and (1−X)*In. Note "In" and "Ip" are different currents than those labeled "ip" and "in" of FIG. 9. The current Ip is equal to the current in Z, 1235, plus a bias current supplied by the bias network 1210. The current In is equal to the current from Z, 1235, plus a bias current supplied by the bias network 1210. The transadmittance stage's 1230 differential output current, Iod, is equal to the difference of the currents Ic1241+Ic1243−Ic1244−Ic1242. If, as in an exemplary form of the invention, equal bias currents are supplied to each pair of transistors T1241, T1242 and T1243, T1244 by bias network 1210, the bias current terms cancel in the previous expression for Iod. In this case, the differential output current, Iod, is related to the modulation index X by the expression: Iod=(2*X−1)*2*Iz, where Iz is the current in impedance Z element 1235 and modulation factor X may be set to a value from approximately zero (0) to approximately 1.

The modulation factor X is set by the control signal Ko. Control signal Ko controls the I_DAC current, which produces the voltage ΔV across resistors R1242 and R1243, thereby setting the modulation factor X. The modulation factor is a well understood parameter that results from a large signal analysis of the effect of a difference voltage on a coupled group of transistors. In general the modulation factor describes the ratio of each collector current to the sum of emitter currents in a differential pair of transistors. For the transistor pair T1241 and T1242 shown in FIG. 12 and neglecting effects due to base currents, T1241's collector current is X*Ip while T1242's collector current is (1−X)*Ip. Similarly, T1244's collector current is X*In while T143's collector current is (1−X)*In. In this representation, X is allowed to vary between 0 and 1, and the total of collector currents for each pair is constant and equal to the total of emitter currents. Ic1241+Ic1242=Ip while Ic1243+Ic1244=In. The collector currents can be written as a function of the voltage between the transistor bases and the total emitter current. Ignoring base currents, the collector currents in FIG. 12 may be described by the following equations, where VT is the thermal voltage and is equal to the product of Boltzmann's constant and the Kelvin temperature divided by the charge of an electron (VT=kT/q):

$Ic1241 = Ip/(1+\exp(-\Delta V/VT)) = X*Ip$ $Ic1242 = Ip/(1+\exp(+\Delta V/VT)) = (1-X)*Ip$ $Ic1243 = In/(1+\exp(+\Delta V/VT)) = (1-X)*In$ $Ic1244 = In/(1+\exp(-\Delta V/VT)) = X*In$ These equations can be solved for X and the modulation factor related to the applied difference voltage, ΔV. Again, ignoring base currents:

$X = 1/(1+\exp(-\Delta V/VT))$ $(1-X) = 1/(1+\exp(\Delta V/VT))$

As mentioned previously, the voltage ΔV across resistors R1242 and R1243 is generated by a current based on current source I_DAC which may be set by the control signal Ko. The control signal Ko can be a digital signal of arbitrary resolution or an analog signal. The current through transistors T1241 to T1244 can create a current corresponding to either a negative or positive impedance at the nodes 1202 and 1203. In combination with the RC network (shown in FIGS. 9 and 10) the current through transistors T1241 to T1244 can produce current corresponding to either positive capacitance or negative capacitance between the input nodes Vip 1212 and Vin 1213 and the output nodes Vop 1202 and Von 1203.

To tune the transadmittance stage 1230 to provide positive or negative capacitance, the control signal Ko can be set to generate an I_DAC that results in a ΔV that properly sets the amount of current that is split between the inner transistor pair T1242, T1243 and the outer transistor pair T1241, T1244. The current I_DAC and resistor R1242 or R1243 create ΔV (ΔV=I_DAC×resistance of either R1242 or R1243) that allows more DC current and signal current to be directed to either the inside [(1−X)*I] path (T1242, T1243) or the outside [X*I] path (T1241, T1244). By changing the polarity of I_DAC current the base voltages of T1242 and T1243 can be made greater than the base voltages of T1241 and T1244, forcing current through the inner transistors T1242 and T1243 to increase the amount of anti-phase current to nodes 1202, 1203. This creates a current corresponding to a negative impedance (−Z). Alternately, a second set of current sources, IDAC N, may be connected at the bases of T1241 and T1244 to pull the bases of T1241 and T1244 lower than the base voltages of T1242 and T1243, again forcing current through the inner transistors T1242 and T1243 and increasing the amount of anti-phase current to nodes 1202, 1203.

The output current at nodes 1202, 1203 to the RC network is Iod=k*Vin*Y(s), where Iod is the output current, k is a scalar including contributions from the modulation factor X, Vin is the difference between VIPI and VINI, and Y(s) is the transadmittance stage transfer function. The current Iod is dependent on the impedance Z element 1235, for example, when Z=1/(s*C) (where C can be a capacitance of impedance element Z 1235 having a predetermined value to provide the desired tuning to the filter and s is the Laplace parameter), the current Iod is equal to k*Vin*s*C. For Z=R (where R equals a resistor of impedance Z element 1235), Iod=k*Vin*1/R: For Z=L*s (where L can be an inductance of impedance Z element 1235 having a predetermined value to provide the desired tuning to the filter and s is the Laplace parameter), Iod=k*Vin*L*s. The effective admittance Yeff of transadmittance stage 1230 may be positive or negative according to the setting of the multiplication factor k, and less than or equal to the admittance value of impedance element Z1235 depending upon the applied current, I_DAC, resistor values R1241, R1242, R1243 and R1244, and positive values of ΔV.

The voltage ΔV between the bases of transistors T1241 and T1242 and between the bases of transistors T1244 and T1243 can be created by any combination of devices. There are many methods of realizing the voltage ΔV that will be obvious to one of ordinary skill in the art. Removing I_DAC and resistors R1242 and R1243 and driving the bases of T1242 and T1243 with dc-shifted replicas of the input voltages, VIPI 1232 and VINI 1233, is one example of other methods.

Figure 13:
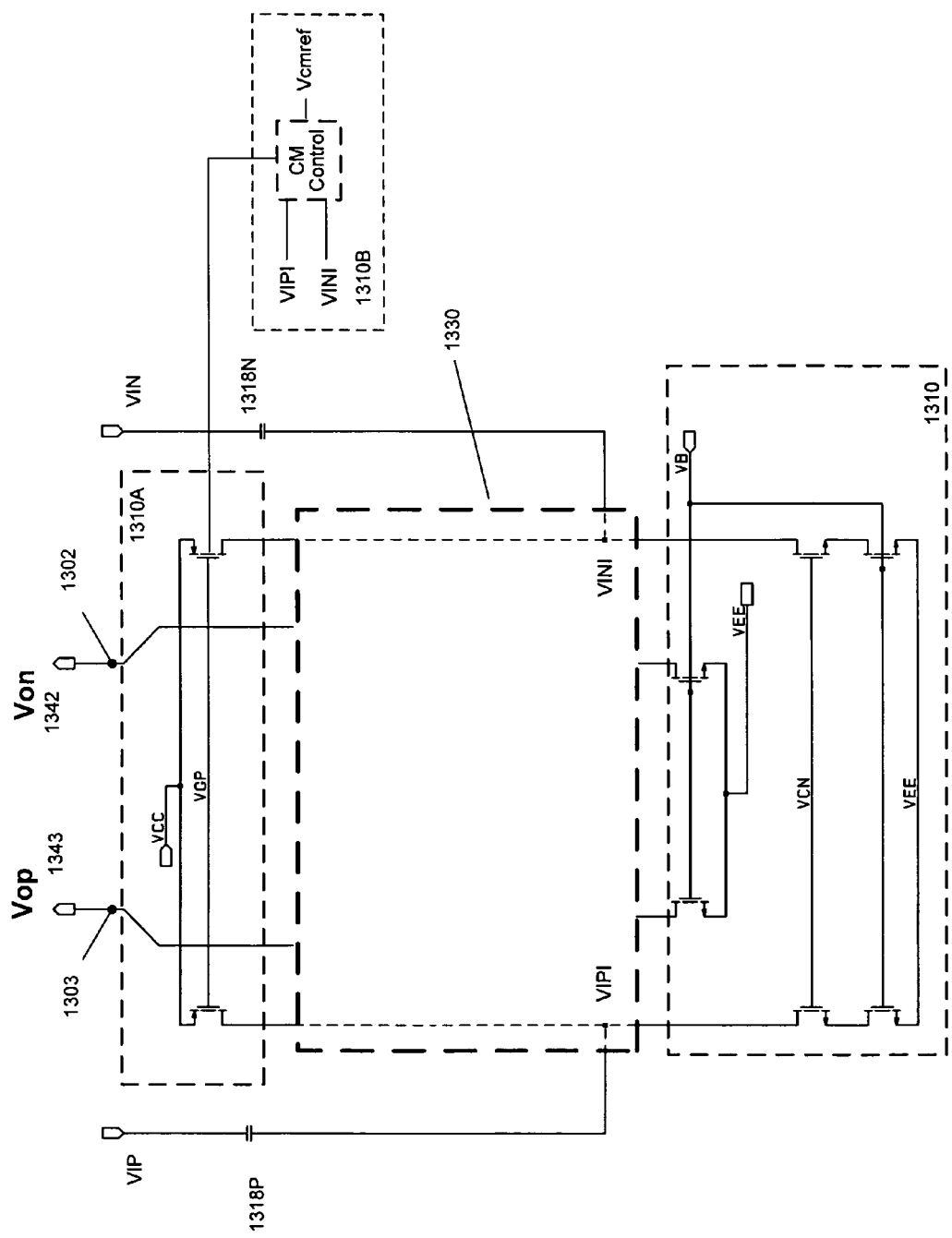
FIG. 13 illustrates another transadmittance stage having a controlled common-mode bias point for improved circuit properties according to yet another exemplary embodiment of the present invention.

FIG. 13 illustrates another embodiment of fine tuning for a well-defined DC bias. Transadmittance stage 1330 is substantially the same as transadmittance stage 1230 of FIG. 12 accordingly additional description is not required. This circuit indicates the setting of the common-mode voltage at the VIPI and VINI nodes, so when AC coupling 1318P and 1318N to the circuit there is a well defined DC operating point. The AC coupling 1318P and 1318N makes the signal path (Vin−Von and Vip−Vop) tolerant to DC voltage offsets associated with signal input. The operation of the circuit is substantially the same as that explained with respect to FIG. 12.

In combination with FIG. 13, the inputs VIP and VIN can be sampled at scaled values of the input signals and dc level-shifted via the ac-coupling capacitors 1318P and 1318N, to provide an input signal at nodes VIPI and VINI that stays within the linear operating range of the components of circuit 1300, which accommodates a substantially larger dynamic and common-mode range of input signals. Control of the common mode voltage VIPI/VINI is shown by the common mode control loop 1310, 1310A and 1310B, which insures an optimal common mode bias condition when AC coupled to circuit inputs or termination RT.

Figure 14:
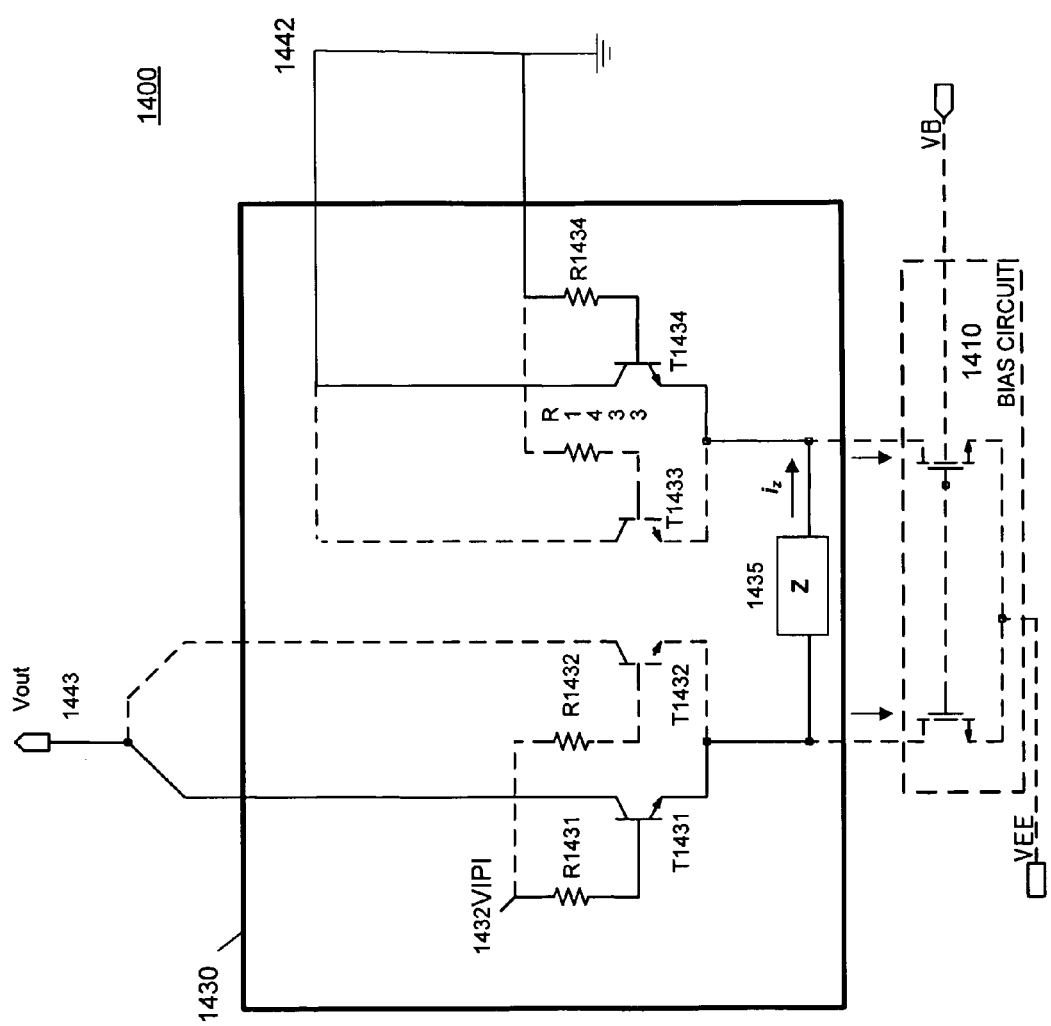
FIG. 14 illustrates an exemplary single-ended embodiment according to the present invention.

FIG. 14 illustrates an exemplary single-ended embodiment according to the present invention. The filter network 1400 comprises a single-ended transadmittance stage 1430 and, optionally, a bias circuit 1410. Similar to the differential embodiments, the single ended embodiment of the transadmittance stage 1430 comprises resistor R1431 and transistor T1431 forming a first branch and resistor R1433 and transistor T1434 forming a second branch. Optionally, each branch can comprise additional resistors, such as resistors R1432 and R1433, and additional transistors, such as transistors T1432 and T1433, to provide additional increments of tuning. The transadmittance stage 1430 also comprises impedance Z element 1435. As in the previously described differential configurations, the transadmittance stage 1430 can also have a control input Ko (Not Shown) that can control the output current of the transadmittance stage 1430. The output 1443 can be connected to a filter network.

In the single-ended embodiment, the input voltage VIPI is input into the transadmittance stage 1430 at input 1432 to apply the input signal to the first branch of the transadmittance stage 1430 and the second branch of the transadmittance stage 1430 is connected to ground at terminal 1442. As in the differential configuration, the voltage difference between the first branch and the second branch of the transadmittance stage 1430 in combination with the value of impedance Z element 1435 and the value of control input Ko determines the value of the voltage and current output at output terminal 1443. The bias circuit 1410 functions in a similar manner as the bias circuit in FIG. 11.

Those skilled in the art can appreciate from the foregoing description that the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A programmable filter circuit, comprising:
input terminals for receiving differential input signals;
output terminals for outputting a filtered signal;
a transadmittance stage, coupled to the input terminals, that generates a differential current at an output thereof based on the received differential input signals, the output of the transadmittance stage being coupled to the output terminals; and
a resistive-capacitive network connected to the input terminals including a capacitance respectively coupling the input terminals to output terminals, and a voltage divider network coupling the input terminals together, the transadmittance stage output terminals connected to the voltage divider, wherein the output terminals of the filter circuit are coupled to respective intermediate nodes of the voltage divider network.

2. The filter of claim 1, the transadmittance stage comprising:
at least a pair of transistors;
a first resistance having plural terminals in which a first resistance terminal of the resistance is connected to a base of a first transistor of the pair of transistors and a second resistance connected to a base of a second transistor of the pair of transistors; and
an impedance connected between an emitter of a first transistor of the pair of transistors and an emitter of a second transistor of the pair of transistors.

3. The filter of claim 2, wherein the impedance has a value that is sized to provide an output signal having variable gain and phase depending upon a frequency of the differential input signals applied to the input terminals.

4. The filter of claim 2, the transadmittance stage further comprising:
a first of the input terminals coupled to a terminal of the first resistance thereby applying a first differential signal to the first resistance, and a second of the input terminals coupled to a terminal of the second resistance thereby applying a second differential signal to the second resistance;

a collector of the first transistor connected to a second of the output terminals and to the collector of the second transistor; and a collector of the second transistor connected to a first of the output terminals and to the collector of the first transistor.

5. The filter of claim 1, wherein the transadmittance stage comprises an input for receiving a control signal that controls a gain of the differential current.

6. The filter of claim 5, wherein the control signal is an analog signal, and the differential current gain of the transadmittance stage is a function of the analog signal.

7. The filter of claim 5, wherein the control signal is a digital signal, and the differential current gain of the transadmittance stage is a function of the digital signal.

8. A programmable filter circuit, comprising:

input terminals for receiving differential input signals;

output terminals for outputting a filtered signal based on the differential input signals;

a transadmittance stage, coupled to the input terminals, that generates a differential current based on the received differential input signals that is output to output terminals of the transadmittance stage; and a resistive-capacitive network connected to the input terminals including a capacitance connected between the input terminal and the output terminal, and a voltage divider network, the transadmittance stage output terminals connected to the voltage divider network, taps of which are connected to the output terminals for contributing a differential potential to the filtered signal.

9. The filter of claim 8, the transadmittance stage further comprising:

at least a pair of transistors;

a first resistance having plural terminals in which a first resistance terminal of the resistance is connected to a base of a first transistor of the pair of transistors and a second resistance connected to a base of a second transistor of the pair of transistors; and an impedance connected between an emitter of a first transistor of the pair of transistors and an emitter of a second transistor of the pair of transistors.

10. The filter of claim 8, the transadmittance stage further comprising:

a first of the input terminals coupled to a terminal of the first resistance thereby applying a first differential signal to the first resistance, and a second of the input terminals coupled to a terminal of the second resistance thereby applying a second differential signal to the second resistance;

a collector of the first transistor connected to a second of the output terminals and to the collector of the second transistor; and a collector of the second transistor connected to a first of the output terminals and to the collector of the first transistor.

11. The filter of claim 10, wherein the impedance has a value that is sized to provide an output signal having variable gain and phase depending upon the frequency of the differential signals applied to the input terminals.

12. The filter of claim 8, wherein the transadmittance stage comprises an input for receiving a control signal that controls differential current gain.

13. The filter of claim 12, wherein the control signal is an analog signal, and the differential current gain of the transadmittance stage is a function of the analog signal.

14. The filter of claim 12, wherein the control signal is a digital signal, and the differential current gain of the transadmittance stage is a function of the digital signal.

15. A method of tuning the output of a circuit, comprising:

sampling differential input voltages;

generating differential currents, by a transadmittance stage, based on the difference between the differential input voltages;

applying the differential input voltages to an resistive-capacitive network thereby generating a current in the resistive-capacitive network;

inputting the generated differential currents to a node of the resistive-capacitive network to sum with the current generated from the differential input voltages; and outputting at a first resistance in the resistive-capacitive network a first tuned voltage and, at a second resistance in the resistive-capacitive network, a second tuned voltage, wherein the first tuned voltage and the second tuned voltage are tuned by the generated differential currents.

16. The method of claim 15, wherein the differential input voltages are sampled from one alternating signal.

17. The method of claim 15, the generating differential currents comprises:

receiving a control signal that controls differential current gain of the transadmittance stage.

18. The method of claim 17, the generating differential currents comprises:

multiplying the differential current generated based on the difference of the differential input voltages by a multiplication factor based on the control signal.

19. The method of claim 17, wherein the received control signal is an analog signal, and the differential current gain of the transadmittance stage is a function of the analog signal.

20. The method of claim 17, wherein the received control signal is a digital signal, and the differential current gain of the transadmittance stage is a function of the digital signal.

* * * * *